United States Patent [19]

Gulett

[11] 4,075,367
[45] Feb. 21, 1978

[54] SEMICONDUCTOR PROCESSING OF SILICON NITRIDE

[75] Inventor: Michael R. Gulett, Dayton, Ohio

[73] Assignee: NCR Corporation, Dayton, Ohio

[21] Appl. No.: 668,167

[22] Filed: Mar. 18, 1976

[51] Int. Cl.² .................. H01L 21/304; H01L 21/306
[52] U.S. Cl. ....................................... 427/94; 96/35.1;
134/2; 427/307; 427/318; 427/327; 427/344; 427/352; 156/659
[58] Field of Search ................. 427/94, 95, 344, 352, 427/307, 318, 327; 96/35.1; 156/17, 659; 134/2

[56] References Cited

U.S. PATENT DOCUMENTS

| | | | |
|---|---|---|---|
| 3,482,977 | 12/1969 | Baker | 156/17 |
| 3,549,368 | 12/1970 | Collins | 96/35.1 |
| 3,586,554 | 6/1971 | Couture et al. | 156/17 |
| 3,706,612 | 12/1972 | Palmer | 156/17 |
| 3,758,306 | 9/1973 | Roos | 96/35.1 |
| 3,867,218 | 2/1975 | Henry | 156/17 |
| 3,898,351 | 8/1975 | Kennison | 427/57 |
| 3,911,169 | 10/1975 | Lesaicherre | 96/35.1 |
| 3,962,004 | 6/1976 | Sonneborn | 96/35.1 |

*Primary Examiner*—Ralph S. Kendall
*Assistant Examiner*—John D. Smith
*Attorney, Agent, or Firm*—J. T. Cavender; Lowell C. Bergstedt; Philip A. Dalton, Jr.

[57] ABSTRACT

A method of providing improved adherence of photoresist to a silicon nitride layer on a semiconductor wafer by first preparing a heated solution of trichlorophenylsilane, immersing the nitride coated wafer in the trichlorophenylsilane solution, drying and baking the wafer prior to the application of the photoresist.

4 Claims, 1 Drawing Figure

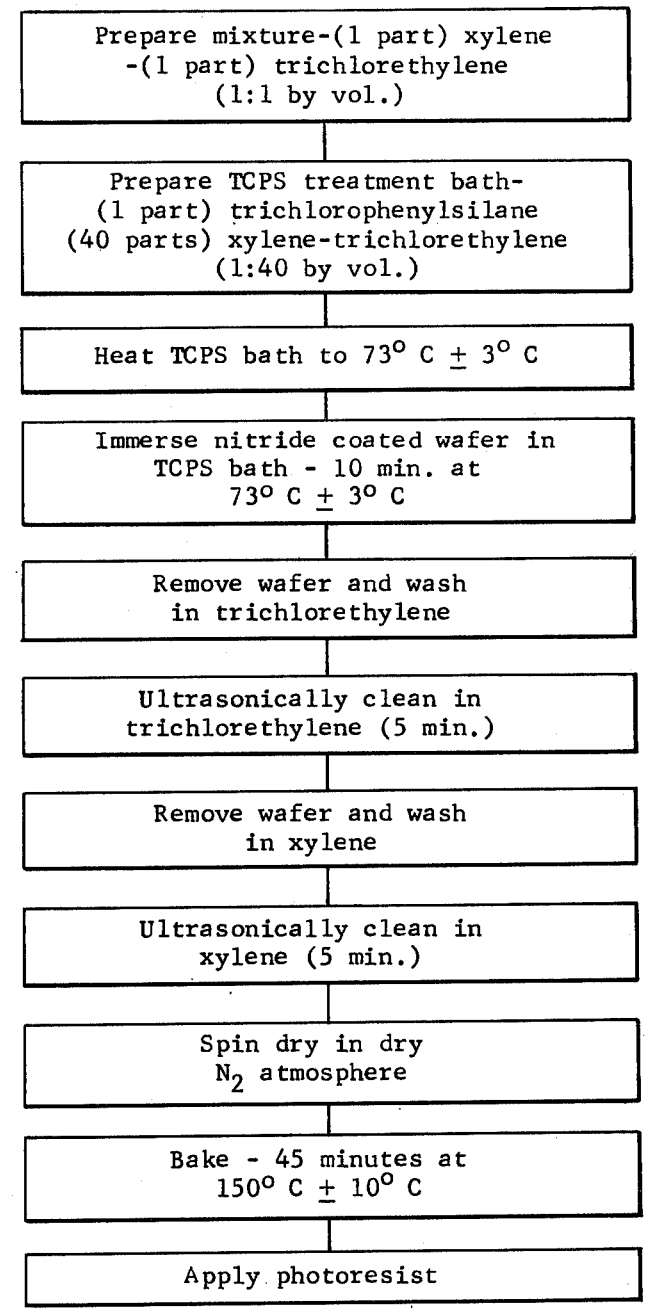

SEMICONDUCTOR PROCESSING OF SILICON NITRIDE

BACKGROUND OF THE INVENTION

1. Field of the Invention

This invention relates to semiconductor processing and more particularly to an improved, simplified method of preparing a semiconductor wafer, having a nitride layer deposited thereon, in preparation for subsequent processing steps.

2. Description of the Prior Art

During the fabrication of, for example, a metal-nitride-oxide-semiconductor (MNOS) device it is necessary to perform various masking operations on the surface of the semiconductor wafer to expose selected areas for either an etching step or for a diffusion step. Typical of such techniques is the fabrication of semiconductor devices such as NPN or PNP single crystal field effect transistors. Traditionally, the active areas of these devices are formed by diffusing appropriate impurities into the selected exposed areas on the surface of the semiconductor body to form either a P-type junction or an N-type junction. In order to have the finished device operate properly, the junction must be discrete, that is, it must only occupy a specific area whose dimensions are maintained at very close tolerances. Similarly, the diffusion or penetration of the impurity into the semiconductor body must be maintained to equally close tolerances and, to accomplish these ends, the surface of the semiconductor material is usually masked in such a manner as to produce openings through which only those areas to be treated are exposed and to protect the remaining areas from any such treatment.

In the past, the prior art has evolved various masking processes for protecting the unexposed areas while producing openings in other areas to be protected. The principal masking operation is accomplished by the use of a layer or coating of photoresist which is a material capable of polymerizing and becoming insoluble after exposure to energy in the visible portion of the spectrum. The photoresist is then selectively subjected to, for example, visible light causing the photoresist to become polymerized in the areas which are desired to be protected from further processing. The unexposed portions are then removed with a solvent which has no affect on the exposed portion. There is thus produced a polymerized photoresist coating on the surface of the wafer that has well defined openings suitable for use in a diffusion step. Further, this process has another advantage in that it may also be used in situations where the subsequent stage in the processing requires an etching step so as to remove certain portions of material previously deposited during the processing procedure. For example, the photoresist layer is used when it is desired to etch through a layer of silicon dioxide as the photoresist is both inert to the hydrogen fluoride solution used to etch the SiO₂ layer and will not lift off of the SiO₂ layer.

However, the photoresist has a very serious drawback due to the fact that it lacks proper adhesion to nitride layers. Accordingly, the prior art has had to resort to an intermediate, time consuming step when one is required to etch through a nitride layer. This intermediate step consists of applying a layer of masking oxide (SiO₂), treating the SiO₂ layer to a densification procedure so as to improve its etchability characteristics as well as its adhesion to the photoresist layer which is subsequently placed atop the SiO₂ masking layer. Thereafter, the photoresist is applied and utilized as a mask to etch the masking SiO₂ layer after which photoresist is removed. The masking SiO₂ layer is then used as a mask for the nitride layer which may then be etched. It has been found that this technique requires additional time and man hours and appreciably increases the cost of the manufacture of the device. For example, it requires at least 1½ hours to provide the wafer with a sufficient thickness of masking oxide and requires at least another hour to appropriately densify the masking oxide.

It is, therefore, reasoned that if one could devise a process which would allow the user to apply photoresist directly to a nitride layer, whee the photoresist would adhere to the nitride during an etching step, considerable time and money would be saved by deleting the need for a densified SiO₂ layer and the need for a double etch.

It is, therefore, an important object of the present invention to provide a photoresist mask that will adhere when applied directly to a nitride layer.

Another important object of this invention is to provide a photoresist mask for a nitride layer that reduces the processing time.

Still another important object of the present invention is to provide a readily strippable photoresist mask that may be applied directly to a nitride layer which mask will remain in place while the nitride layer is being etched.

Yet another important object of the present invention is to provide an adherent photoresist which may be applied directly to a nitride surface and thereby reduce the processing time for a semiconductor device.

BRIEF DESCRIPTION OF THE INVENTION

In accordance with the teachings of my invention, after a semiconductor wafer has had a layer of silicon nitride deposited thereon, I propose that the exposed nitride layer be treated with a solution of trichlorophenylsilane after which the nitride coated wafer is baked and coated with photoresist. The resultant coating is sufficiently adherent to withstand any subsequent etching treatment to which the wafer may be subjected.

DESCRIPTION OF THE DRAWING

The FIGURE indicates the sequence for preparing a silicon nitride layer for the deposition of an adherent photoresist thereto.

DESCRIPTION OF THE PREFERRED EMBODIMENT

Referring now to FIG. 1, for the steps in the sequence of preparing a silicon nitride layer for the deposition of a photoresist mask thereon it will be seen that the preconditioning of the nitride layer is initiated by first preparing a mixture consisting of high purity, electronic grade xylene and electronic grade trichlorethylene in a 1:1 ratio by volume. The mixture is then heated to a temperature of about 73° C ± 3° C after which one part of electronic grade trichlorophenylsilane is added for each 40 parts, by volume of the xylene-trichlorethylene mixture to form a "TCPS treatment bath".

The trichlorophenylsilane (TCPS) treatment bath is maintained at a temperature of about 73° C ± 3° C at which time the semiconductor wafer, having the exposed nitride layer thereon, is immersed therein. The wafer is maintained in the TCPS treatment bath for a period of about 10 minutes while the bath is maintained at about 73° C ± 3° C. The wafer is then removed and washed first in a container of electronic grade trichlorethylene, maintained at room temperature, for a period of about 30 seconds after which the container bearing the wafer is subjected to an ultrasonic cleaning step for a period of about 5 minutes.

The wafer is then removed from the trichlorethylene and washed in a container of electronic grade xylene maintained at room temperature, for a period of about 30 seconds, after which the xylene bath, containing the wafer, is ultrasonically cleaned for a period of about 5 minutes.

Thereafter, the wafer is removed from the xylene bath and placed in a dry nitrogen atmosphere where it is spin dried for a period of about 2 to 3 minutes, at room temperature. The wafer is then placed in an oven and baked for a period of about 45 minutes at a temperature of about 150° C ± 10° C.

Thereafter, a layer of photoresist may be applied directly to the nitride layer and will adhere thereto until it is chemically removed and no portion of the photoresist will lift off the nitride during a subsequent hydrofluoric acid etch.

What I claim is:

1. A method of preparing a silicon nitride surface on a semiconductor device for improving the adhesion of photoresist material to withstand a hydrofluoric acid etchant, comprising the steps of:
   a. preparing a treatment bath consisting essentially of xylene, trichlorethylene, and trichlorophenylsilane in a ratio of 20:20:1 respectively by volume having a temperature of from 70° C to 76° C;
   b. immersing said surface in said bath for about 10 minutes;
   c. removing said surface from said bath and washing it in a trichlorethylene bath at room temperature;
   d. subjecting said surface to ultrasonic cleaning while in said trichlorethylene bath;
   e. removing said surface from said trichlorethylene bath and washing it in a xylene bath at room temperature;
   f. subjecting said surface to ultrasonic cleaning while in said xylene bath;
   g. removing said surface from said xylene bath and spin drying it in a nitrogen atmosphere at room temperature; and
   h. baking said surface for about 45 minutes at a temperature of 140° C to 160° C.

2. The method of claim 1 wherein said treatment bath is prepared by mixing one part by volume of xylene with one part by volume of trichlorethylene, heating the mixture from about 70° C to 76° C, and adding one part by volume of trichlorophenylsilane to 40 parts by volume of the xylene-trichlorethylene mixture.

3. The method of claim 1 wherein said surface is washed in said trichlorethylene and xylene baths for approximately 30 seconds each and wherein said surface is ultrasonically cleaned in said trichlorethylene and xylene baths for about 5 minutes each.

4. The method of claim 1 wherein said surface is spin dryed for a period of from 2 to 3 minutes.

* * * * *